(12) United States Patent
Dubey

(10) Patent No.: US 6,650,162 B2
(45) Date of Patent: Nov. 18, 2003

(54) DIGITAL CLOCK GENERATOR CIRCUIT WITH BUILT-IN FREQUENCY AND DUTY CYCLE CONTROL

(75) Inventor: Prashant Dubey, Uttar Pradesh (IN)

(73) Assignee: STMicroelectronics Ltd., Uttar Pradesh (IN)

( * ) Notice: Subject to any disclaimer, the term of this patent is extended or adjusted under 35 U.S.C. 154(b) by 0 days.

(21) Appl. No.: 09/988,883

(22) Filed: Nov. 20, 2001

(65) Prior Publication Data

US 2002/0079943 A1 Jun. 27, 2002

(30) Foreign Application Priority Data

Nov. 23, 2000 (IN) .................................. 1049/DEL/2000

(51) Int. Cl.[7] ................................................ G06F 1/04
(52) U.S. Cl. ........................ 327/291; 327/294; 327/175
(58) Field of Search .............................. 327/291, 293, 327/294, 295, 296, 297, 299, 113, 114, 115, 116, 175; 331/57, 111, 143, DIG. 3

(56) References Cited

U.S. PATENT DOCUMENTS

| | | | | | |
|---|---|---|---|---|---|
| 5,126,691 A | * | 6/1992 | Mijuskovic et al. | ........ | 331/1 A |
| 5,442,324 A | * | 8/1995 | Brauns | ........................ | 331/34 |
| 5,666,088 A | * | 9/1997 | Penza | ........................... | 331/34 |
| 5,815,043 A | * | 9/1998 | Chow et al. | ................... | 331/57 |
| 5,909,151 A | * | 6/1999 | Leuthold | ..................... | 331/57 |
| 6,144,262 A | * | 11/2000 | Kingsley | ..................... | 331/57 |
| 6,232,845 B1 | * | 5/2001 | Kingsley et al. | .............. | 331/57 |
| 6,233,205 B1 | * | 5/2001 | Wells et al. | ................ | 368/118 |
| 6,310,928 B1 | * | 10/2001 | Yunome | ..................... | 375/376 |
| 6,424,192 B1 | * | 7/2002 | Lee et al. | ................... | 327/156 |
| 6,442,704 B1 | * | 8/2002 | Morimoto et al. | .......... | 713/500 |
| 6,452,459 B1 | * | 9/2002 | Chan et al. | ................... | 331/57 |

* cited by examiner

*Primary Examiner*—Timothy P. Callahan
*Assistant Examiner*—Hai L. Nguyen
(74) *Attorney, Agent, or Firm*—Lisa K. Jorgenson; Allen, Dyer, Doppelt, Milbrath & Gilchrist, P.A.

(57) ABSTRACT

A digital clock generator circuit with built-in frequency and duty cycle control may include a pulse generator for generating a start pulse. The pulse generator may be connected to a ring oscillator to generate multiple signals having a specified frequency and programmable duty cycles. The oscillator may further be connected to a multiplexer which selectively connects one output of the ring oscillator to a final output to produce a signal of the specified frequency and specified duty cycle. The duty cycle may be adjustable over a wide range and across the full frequency band of operation.

25 Claims, 3 Drawing Sheets

DIGITAL CLOCK GENERATOR CIRCUIT WITH BUILT-IN FREQUENCY AND DUTY CYCLE CONTROL

FIELD OF THE INVENTION

The present invention relates to the field of electronic circuits, and, more particularly, to a digital clock generator circuit with built-in frequency and duty cycle control.

BACKGROUND OF THE INVENTION

More and more circuitry is being included in application specific integrated circuit (ASIC) chips. The technology trends are following Moore's law. As a result, every year the technology shrinks roughly by a factor of 1.5. For example, high speed clock generation, which formerly was done externally (e.g., using automatic test equipment), is now being done on-board the chip itself.

The variable duty cycle generator can be produced by performing Boolean operations on the clock and by phase delay of the clock. Phase delay is obtained by using a chain of delay logic elements. Outputs are taken at various points along the chain to get clocks with different phase. If both phase change and variable frequency are required, then two different circuits will be needed. If the duty cycle variation is done through a separate circuit, the resolution of the duty cycle can be maintained at sufficient levels, but the range of the duty cycle will be low. Further, a good ratio of the duty cycle resolution to the clock frequency cannot be maintained with decreasing frequency.

SUMMARY OF THE INVENTION

An object of the invention is to provide a digital clock generator circuit with built-in frequency and duty cycle control which provides a good range of duty cycle for the full frequency range.

Another object of the invention is to provide a digital clock generator circuit with built-in frequency and duty cycle control, independent of the technology process used for manufacture, as well as special patterns for frequency generation.

Yet another object of the invention is to provide a circuit which provides a variable duty cycle at various frequencies where the variation is automatically proportionate to the frequency of the clock.

To achieve the above objectives, the invention provides a digital clock generator circuit with built-in frequency and duty cycle control which may include a pulse generator block for generating a start pulse. The pulse generator may be connected to a ring oscillator block to generate multiple signals having a specified frequency and programmable duty cycles. Further, the ring oscillator block may be connected to a multiplexer block which selectively connects one of the outputs of the ring oscillator to the final output to produce a signal of the specified frequency and specified duty cycle. As a result, the duty cycle may be adjustable over a wide range and across the full frequency band of operation.

The pulse width of the start pulse may be controlled through a pulse width controller built into the pulse generator. Further, the ring oscillator block may include flip-flops connected in cascade, with the output of one flip-flop connected to the clock input of the next flip-flop and the output of the last flip-flop connected to the clock input of the first flip-flop to form a ring. The flip-flops may be arranged in two halves, each having an equal number of flip-flops, where the clear input of the flip-flops of each half are connected to a global reset. Additionally, a programmable delay means or circuit may be provided in the global reset path to avoid recovery and hold time problems. Also, a multiplexer block may be included to selectively change the number of flip-flops connected in cascade to vary the frequency generated.

The number of flip-flops in each of the halves may depend upon the frequency of generation and duty cycle. The duration of the pulse output from the pulse generator may be programmable between four different values based on the logic levels of the input signals PW_STROBE0 and PW_STROBE1, for example. The data input of each of the flip-flops of both the halves may be connected to logic 1 if the global reset is connected to its clear input, and to a logic 0 if the global reset is connected to its preset input.

The multiplexer block may select one of the outputs from the ring oscillator to provide a signal of the required duty cycle. The resolution of the high time adjustment may be defined as Td=1/NF, and the duty cycle variation may be defined as Tdc=1/N, where N is the number of flip-flops in the ring of flip-flops and F is the frequency at any point of the chain. Also, the digital clock generator circuit may be used to measure the propagation delay of the flip-flop elements included therein.

BRIEF DESCRIPTION OF THE DRAWINGS

The invention will now be described with reference to the accompanying drawings, in which.

DETAILED DESCRIPTION OF THE PREFERRED EMBODIMENTS

Figure 1:
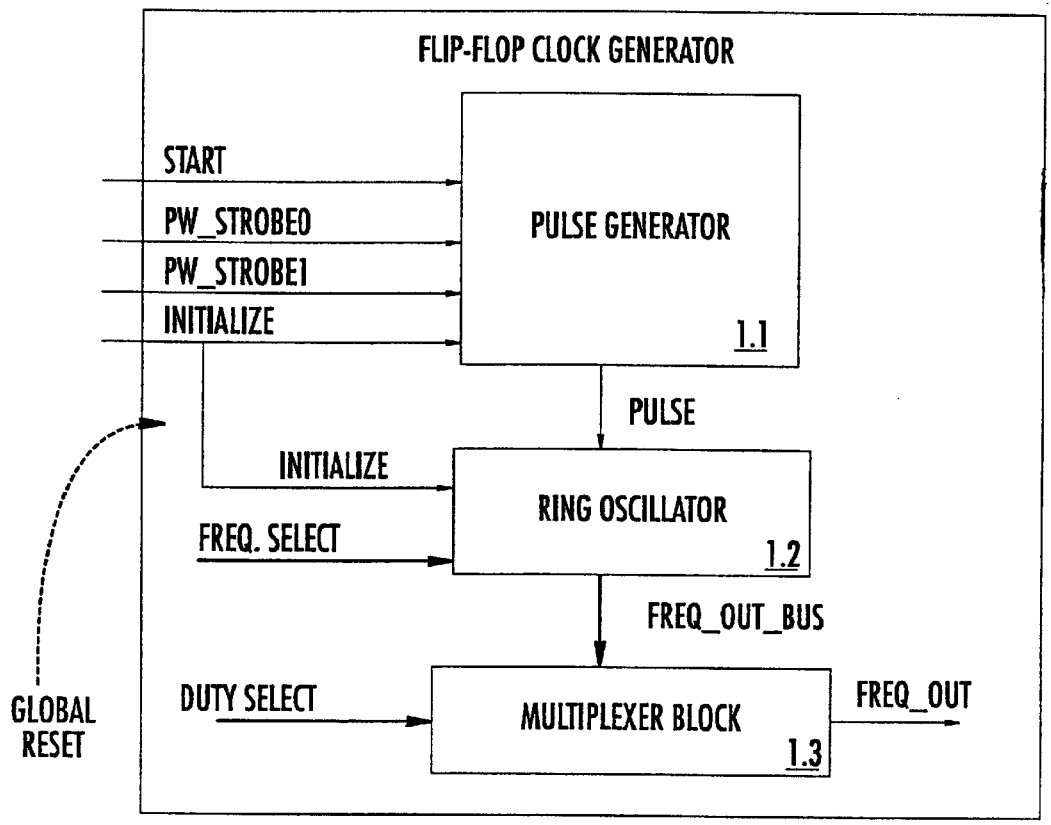
FIG. 1 is a schematic block diagram of a variable frequency and duty cycle generator according to the invention.

Turning now to FIG. 1, a pulse generator 1.1 generates a start pulse PULSE which is fed to one input of a ring oscillator 1.2. The width of the pulse is controlled by a pulse width controller (not shown) built into the pulse generator 1.1. A programmable delay circuit (not shown) based on the value of inputs PW_STROBE0 and PW_STROBE1, the delay can have four different values starting from a minimum [0,0] to a maximum [1,1].

The output of the ring oscillator 1.2 is fed to the input of the multiplexer in the form of multiple signals of single frequency but varying duty cycle. The multiplexer block 1.3 selects one of the input signals based on the value of selection signal DUTY SELECT as the final output of the circuit.

Figure 2:
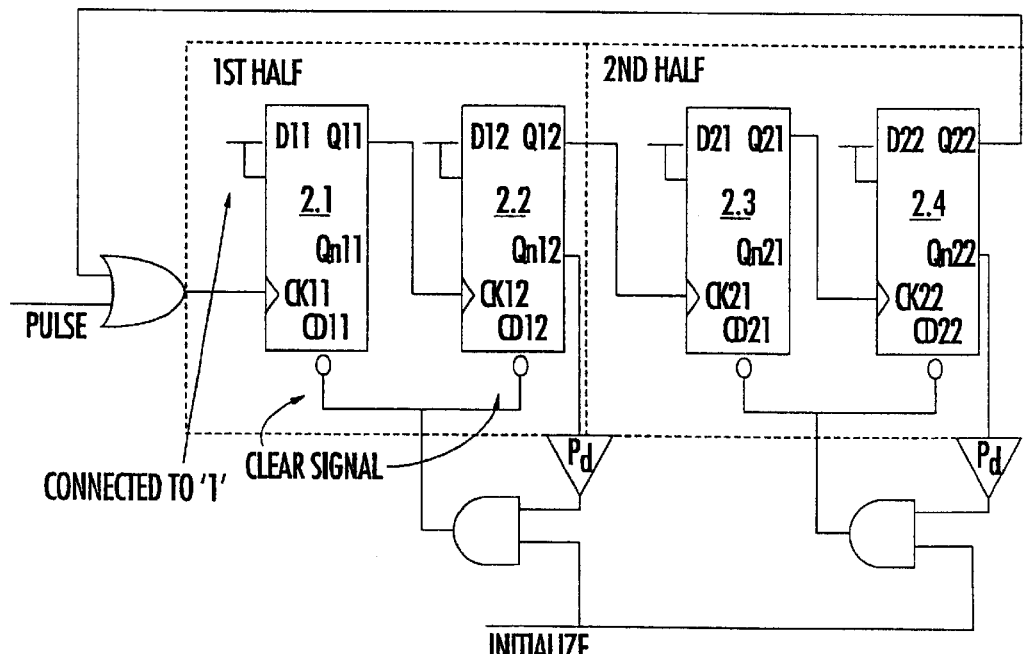
FIG. 2 is a schematic block diagram of the ring oscillator of FIG. 1.

Referring to FIG. 2, the ring oscillator block 1.2 includes a ring of flip-flops, the inputs and outputs of which are as illustratively shown. All the flip-flops are connected in cascade so that the output of one flip-flop is the clock of the next flip-flop and so on until the output of the last flip-flop 2.4 becomes the clock of the first flip-flop 2.1 after ORing with the external signal PULSE.

There are two halves of flip-flops in the ring, each including an equal number of flip-flops (i.e., the first half includes the flip-flops 2.1, 2.2, and the second half includes the flip-flops 2.3, 2.4, which are delineated with dotted lines in FIG. 2). The clear inputs of the flip-flops of the two halves are connected to a global reset INITIALIZE. The number of flip-flops in each of the halves depends upon the frequency of generation and duty cycle. A multiplexer block in the ring oscillator (not shown) selectively changes the number of flip-flops connected in the cascade to vary the frequency generation. Also, programmable delay elements $P_d$ are placed in the reset paths to get a first pulse width (which can be used as a clock) and to assure that no problem such as recovery or removal occurs at the flip-flop which resets itself.

The data input to the flip-flops of the two halves are connected to a logic 1 for flip-flops which have a clear input. For the flip-flops with a preset input instead of a clear input, the data inputs are tied to logic 0. The resolution of the high time adjustment is $Td=1/NF$ and the duty cycle variation is $Tdc=1/N$, where N is the number of flip-flops used in the whole ring of flip-flops and F is the frequency taken at any point on the chain.

Figure 3:
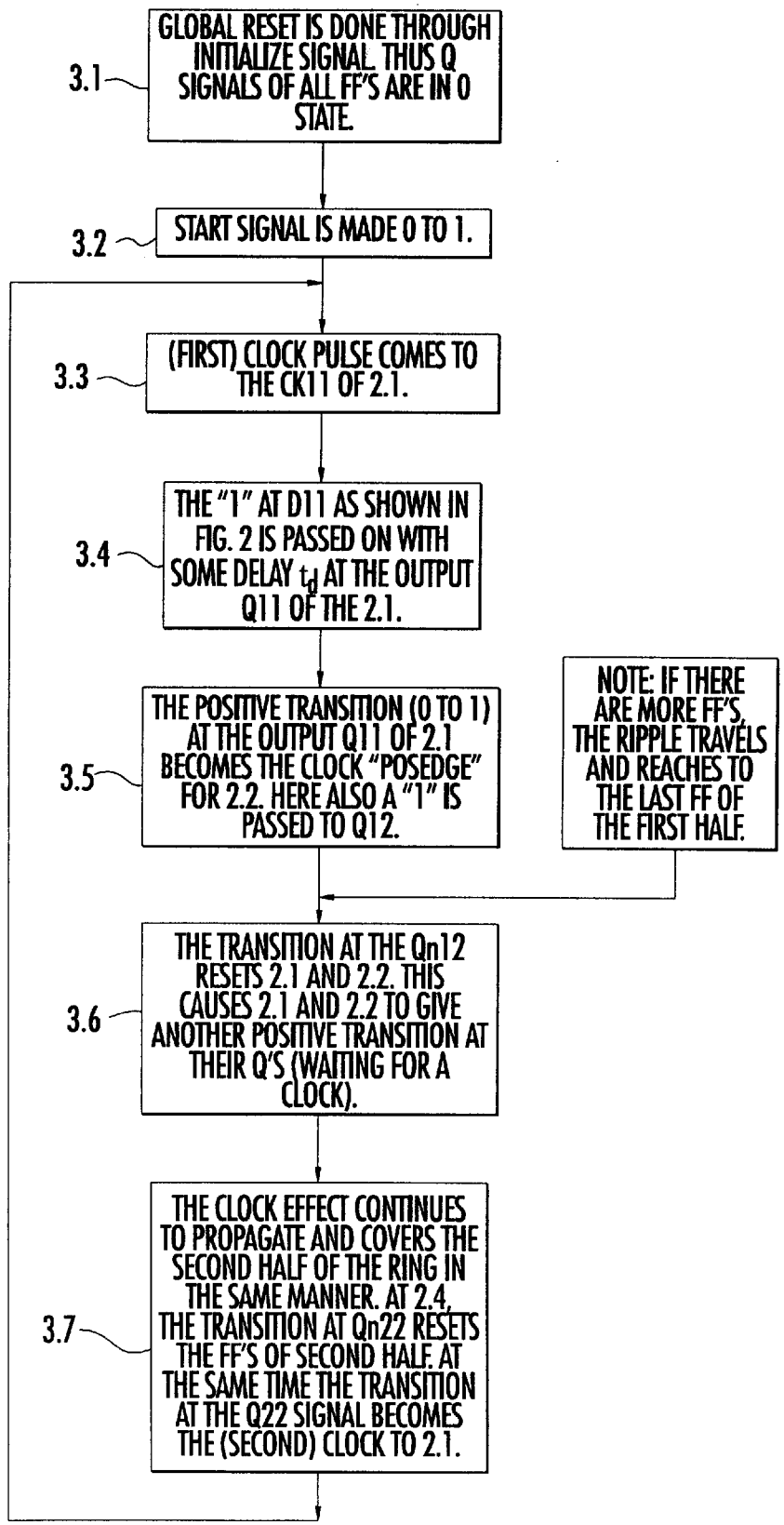
FIG. 3 is a flow diagram illustrating operation of the ring oscillator of FIG. 2.

A flow diagram of the operation of the ring oscillator 1.2 is illustrated in FIG. 3. Global reset is done through the initialize pins, thus the Q pins of all flip-flops are in a 0 state, at Block 3.1, and the start pin is switched from logic 0 to logic 1, at Block 3.2. The first clock pulse comes to the clock input of the first flip-flop (Block 3.3), and the data logic 1 is passed on with some delay (Td) at the output of the first flip-flop, at Block 3.4. Further, the positive transition from logic 0 to logic 1 at the output of the first flip-flop becomes the clock "posedge" for the next flip-flop. Here also logic 1 is passed to the output of the next flip-flop, at Block 3.5.

The transition at the output of the second flip-flop 2.2 in the first half resets the first flip-flop 2.1 and the second flip-flop 2.2. This causes the first and second flip-flops 2.1, 2.2 in the first half to give another positive transition at their respective outputs Q11, Q12 (Block 3.6). The clock effect continues to propagate and covers the second half of the ring of flip-flops in the same manner. At the second flip-flop 2.4 of the second half of the ring oscillator, the transition at the output resets the flip-flops 2.3, 2.4 of the second half. At the same time, the transition at the output of the second flip-flop 2.4 of the second half of the ring oscillator becomes the clock to the first flip-flop 2.1 of the first half.

Figure 4:
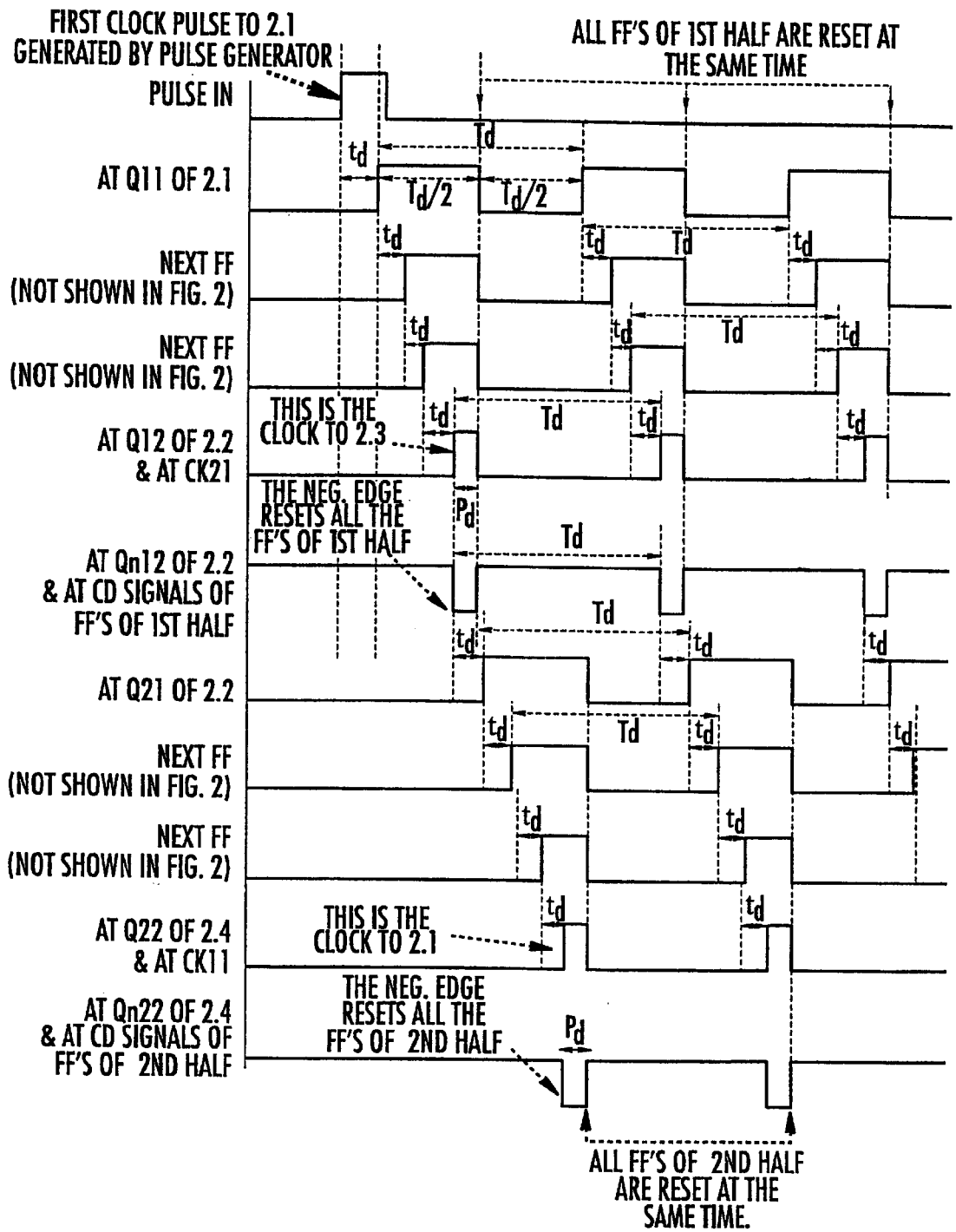
FIG. 4 is a waveform diagram for the ring oscillator of FIG. 2.

A waveform diagram for the ring oscillator block 1.2 is illustratively shown in FIG. 4. The diagram illustrates a period beginning shortly before the first clock pulse is generated by the pulse generator 1.1 and fed to the ring oscillator 1.2. The various waveforms at the various stages of the flip-flops are as illustratively shown. In the figure, $T_d$ is the CP2Q delay of one flip-flop, $T_d$ is the total delay of all of the flip-flops, and $P_d$ is the programmable delay in the reset path.

That which is claimed is:

1. A digital clock generator circuit having built-in frequency and duty cycle control and comprising:
   a pulse generator for generating a start pulse;
   a ring oscillator connected to said pulse generator for generating a plurality of signals having a predetermined frequency and respective programmable duty cycles;
   said ring oscillator comprising a plurality of flip-flops divided into first and second portions such that an output of a last flip-flop in the first portion resets all of the flip-flops in the first portion and an output of a last flip-flop in the second portion resets all of the flip-flops in the second portion; and
   a multiplexer coupled to said ring oscillator for selectively providing one of the plurality of signals as a final output of the digital clock generator circuit.

2. The digital clock generator circuit of claim 1 wherein paid pulse generator comprises a pulse width controller for controlling a width of the start pulse.

3. The digital clock generator circuit of claim 1 wherein a duration of the start pulse is programmable between a plurality of different values.

4. The digital clock generator circuit of claim 1 wherein said digital clock generator circuit further comprises circuitry for measuring a propagation delay of said flip-flops.

5. The digital clock generator circuit of claim 1 wherein the first and second portions each comprise an equal number of flip-flops, each flip-flop also being connected to a global reset; and wherein said ring oscillator further comprises:
   at least one programmable delay device connecting the global reset to said plurality of flip-flops; and
   a ring multiplexer for selectively connecting and disconnecting each of said flip-flops to said ring of flip-flops to vary the predetermined frequency.

6. The digital clock generator circuit of claim 5 wherein said ring multiplexer selectively connects and disconnects each flip-flop to said ring of flip-flops to also vary the programmable duty cycles.

7. The digital clock generator circuit of claim 5 wherein a resolution of high time adjustment of the signals equals 1/NF and a duty cycle variation of the signals equals 1/N, where N is the number of flip-flops in said ring of flip-flops and F is the predetermined frequency.

8. A digital clock generator circuit comprising:
   a pulse generator for generating a start pulse;
   a ring oscillator connected to said pulse generator for generating a plurality of signals having a predetermined frequency and respective programmable duty cycles;
   said ring oscillator comprising a plurality of flip-flops divided into first and second portions such that an output of a last flip-flop in the first portion resets all of the flip-flops in the first portion and an output of a last flip-flop in the second portion resets all of the flip-flops in the second portion; and
   a multiplexer coupled to said ring oscillator for selectively providing one of the plurality of signals as a final output of the digital clock generator circuit.

9. The digital clock generator circuit of claim 8 wherein said pulse generator comprises a pulse width controller for controlling a width of the start pulse.

10. The digital clock generator circuit of claim 8 wherein each flip-flop is connected to a global reset; and wherein said ring oscillator further comprises at least one programmable delay device connecting the global reset to said plurality of flip-flops.

11. The digital clock generator circuit of claim 8 wherein a resolution of high time adjustment of the signals equals 1/NE and a duty cycle variation of the signals equals 1/N, where N is the number of flip-flops in said ring of flip-flops and F is the predetermined frequency.

12. The digital clock generator circuit of claim 8 wherein said duration of the start pulse is programmable between a plurality of different values.

13. The digital clock generator circuit of claim 8 wherein said digital clock generator circuit further comprises circuitry for measuring a propagation delay of said flip-flops.

14. The digital clock generator circuit of claim 8 wherein said ring oscillator further comprises a ring multiplexer for selectively connecting and disconnecting each of said flip-flops to said ring of flip-flops to vary the predetermined frequency.

15. The digital clock generator circuit of claim 14 wherein said ring multiplexer selectively connects and disconnects each flip-flop to said ring of flip-flops to also vary the programmable duty cycles.

16. A digital clock generator circuit comprising:
a pulse generator for generating a start pulse programmable between a plurality of different values;
a ring oscillator connected to said pulse generator for generating a plurality of signals having a predetermined frequency and respective programmable duty cycles;
said ring oscillator comprising a plurality of flip-flops divided into first and second portions such that an output of a last flip-flop in the first portion resets all of the flip-flops in the first portion and an output of a last flip-flop in the second portion resets all of the flip-flops in the second portion, the first and second portions each comprising an equal number of flip-flops;
a multiplexer coupled to said ring oscillator for selectively providing one of the plurality of signals as a final output of the digital clock generator circuit; and
circuitry for measuring a propagation delay of said flip-flops.

17. The digital clock generator circuit of claim 16 wherein said pulse generator comprises:
a pulse width controller for controlling a width of the start pulse.

18. The digital clock generator circuit of claim 16 wherein each flip-flop is also connected to a global reset;
at least one programmable delay device connecting the global reset to plurality of flip-flops; and
a ring multiplexer for selectively connecting and disconnecting each of said flip-flops to said ring of flip-flops to vary the predetermined frequency.

19. The digital clock generator circuit of claim 18 wherein said ring multiplexer selectively connects and disconnects each flip-flop to said ring of flip-flops to also vary the programmable duty cycles.

20. The digital clock generator circuit of claim 18 wherein a resolution of high time adjustment of the signals equals 1/NF and a duty cycle variation of the signals equals 1/N, where N is the number of flip-flops in said ring of flip-flops and F is the predetermined frequency.

21. A method for generating digital clock signals comprising:
generating a start pulse;
generating a plurality of signals using a ring oscillator and based up n the start pulse having a predetermined frequency and respective programmable duty cycles;
the ring oscillator comprising a plurality of flip-flops divided into first F and second portions such that an output of a last flip-flop in the first portion resets all of the flip-flops in the first portion and an output of a last flip-flop in the second portion resets all of the flip-flops in the second portion; and
selectively providing one of the plurality of signals as a final output based upon a desired duty cycle.

22. The method of claim 21 wherein generating the start pulse comprises generating the start pulse with a pulse width controller and controlling a width thereof.

23. The method of claim 21 wherein each flip-flop is connected to a global reset.

24. The method of claim 23 wherein generating the plurality of signals further comprises selectively connecting and disconnecting each of the flip-flops to the ring of flip-flops to vary the predetermined frequency.

25. The method of claim 24 wherein generating the plurality of signals further comprises selectively connecting each of the flip-flops to the ring of flip-flops to vary the predetermined frequency and the programmable duty cycles.

* * * * *

UNITED STATES PATENT AND TRADEMARK OFFICE
CERTIFICATE OF CORRECTION

PATENT NO. : 6,650,162 B2
DATED : November 18, 2003
INVENTOR(S) : Prashant Dubey It is certified that error appears in the above-identified patent and that said Letters Patent is hereby corrected as shown below:

Column 4,
Line 2, delete "paid" insert -- said --

Column 6,
Line 12, delete "up n" insert -- upon --
Line 15, delete "first F and" insert -- first and --

Signed and Sealed this

Twentieth Day of January, 2004

JON W. DUDAS
*Acting Director of the United States Patent and Trademark Office*